United States Patent
Ellinger

(10) Patent No.: US 10,020,327 B2
(45) Date of Patent: Jul. 10, 2018

(54) METHOD FOR SELECTIVE THIN FILM DEPOSITION

(71) Applicant: Eastman Kodak Company, Rochester, NY (US)

(72) Inventor: Carolyn Rae Ellinger, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 51 days.

(21) Appl. No.: 15/175,082

(22) Filed: Jun. 7, 2016

(65) Prior Publication Data
US 2017/0352691 A1 Dec. 7, 2017

(51) Int. Cl.
| | | |
|---|---|---|
| H01L 27/12 | (2006.01) | |
| H01L 21/02 | (2006.01) | |
| H01L 29/66 | (2006.01) | |
| H01L 29/786 | (2006.01) | |
| H01L 21/32 | (2006.01) | |

(52) U.S. Cl.
CPC ...... *H01L 27/1262* (2013.01); *H01L 21/0228* (2013.01); *H01L 21/0262* (2013.01); *H01L 21/02554* (2013.01); *H01L 21/02565* (2013.01); *H01L 21/02642* (2013.01); *H01L 21/32* (2013.01); *H01L 27/127* (2013.01); *H01L 27/1218* (2013.01); *H01L 29/66969* (2013.01); *H01L 29/7869* (2013.01)

(58) Field of Classification Search
CPC ........... H01L 21/02642; H01L 27/1262; H01L 27/127; H01L 21/0228; H01L 21/32; C23C 16/042
See application file for complete search history.

(56) References Cited

U.S. PATENT DOCUMENTS

| | | |
|---|---|---|
| 7,160,819 B2 | 1/2007 | Conley, Jr. et al. |
| 7,789,961 B2 | 9/2010 | Nelson et al. |
| 7,846,644 B2 | 12/2010 | Irving et al. |
| 7,998,878 B2 | 8/2011 | Levy et al. |
| 8,017,183 B2 | 9/2011 | Yang et al. |
| 8,030,212 B2 | 10/2011 | Yang et al. |
| 8,153,529 B2 | 4/2012 | Levy |
| 8,168,546 B2 | 5/2012 | Levy |

(Continued)

OTHER PUBLICATIONS

Ashwini Sinha et al., "Area selective atomic layer deposition of titanium dioxide: Effect of precursor chemistry," J. Vac. Sci. Technol. B 24(6), Nov./Dec. 2006 pp. 2523-2532.

*Primary Examiner* — Bac Au
(74) *Attorney, Agent, or Firm* — J. Lanny Tucker

(57) ABSTRACT

A method device is prepared with a patterned thin film that can include one or more metal oxides on a suitable substrate. Initially, a pattern of a deposition inhibitor is provided on a surface of the substrate, which deposition inhibitor comprises at least one cellulose ester. This pattern has both inhibitor areas where the deposition inhibitor is present and open areas where the deposition inhibitor is absent. An inorganic thin film is then deposited on the surface of the substrate by a chemical vapor deposition process only in the open areas of the pattern. Further operations can be carried out including deposit of a second inorganic thin film exactly over the initial inorganic thin film, the deposition inhibitor can be removed from the inhibitor areas of the pattern, or both operations can be carried out in sequence.

21 Claims, 5 Drawing Sheets

(56) References Cited

U.S. PATENT DOCUMENTS

| | | | |
|---|---|---|---|
| 8,318,249 B2 | 11/2012 | Levy | |
| 8,618,003 B2 | 12/2013 | Burberry et al. | |
| 8,921,236 B1 | 12/2014 | Ellinger et al. | |
| 8,937,016 B2 | 1/2015 | Ellinger et al. | |
| 9,202,898 B2 | 12/2015 | Ellinger et al. | |
| 9,685,638 B2 * | 6/2017 | Fleissner | H01L 51/56 |
| 2002/0029906 A1 * | 3/2002 | Echigo | H05K 3/0032 |
| | | | 174/265 |
| 2006/0119669 A1 * | 6/2006 | Sharma | B41J 2/03 |
| | | | 347/82 |
| 2009/0051740 A1 | 2/2009 | Hiroshima | |
| 2009/0081827 A1 | 3/2009 | Yang et al. | |
| 2009/0130858 A1 | 5/2009 | Levy | |

* cited by examiner

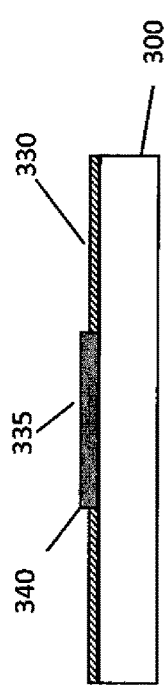
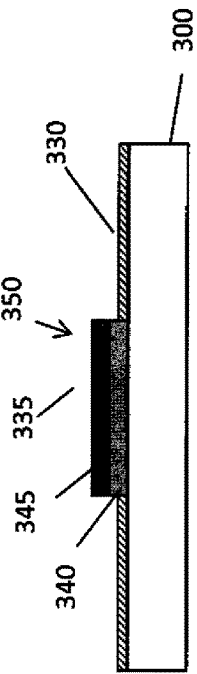
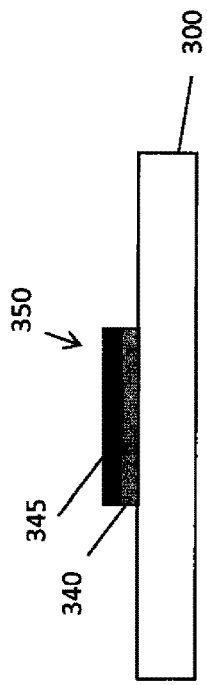
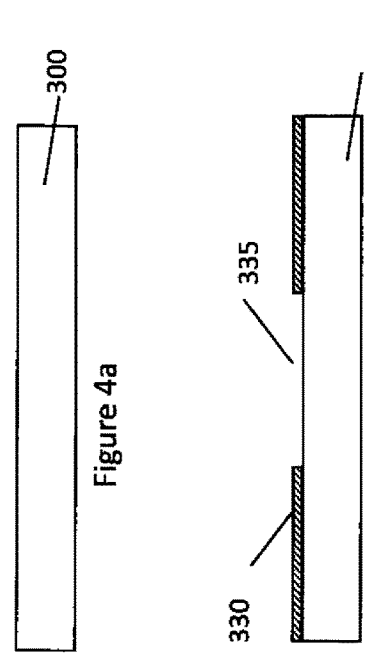

METHOD FOR SELECTIVE THIN FILM DEPOSITION

FIELD OF THE INVENTION

This invention relates to a method for producing patterned thin films on substrates by atomic layer deposition using cellulose esters as deposition inhibitor materials in selective (patternwise) deposition operations. This invention also relates to electronic devices prepared using this method.

BACKGROUND OF THE INVENTION

Modern-day electronics require multiple patterned layers of electrically or optically active materials, sometimes over a relatively large substrate. Electronics such radio frequency identification (RFID) tags, photovoltaics, and optical and chemical sensors all require some level of patterning in their electronic circuitry. Flat panel displays, such as liquid crystal displays or electroluminescent displays rely upon accurately patterned sequential layers to form thin film components of the backplane. These thin film components include capacitors, transistors, and power buses. The industry is continually looking for new methods of materials deposition and layer patterning for both performance gains and cost reductions.

Thin film transistors (TFT's) may be viewed as representative of the electronic and manufacturing issues for many thin film components. TFT's are widely used as switching elements in electronics, for example, in active-matrix liquid-crystal displays, smart cards, and a variety of other electronic devices and components thereof. A TFT is an example of a field effect transistor (FET) and the best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating a thin film transistor involves the deposition of a semiconductor onto the substrate. Presently, most thin film devices are made using vacuum deposited amorphous silicon as the semiconductor, which is patterned using traditional photolithographic methods. Amorphous silicon as a semiconductor for use in TFT's still has its drawbacks. Thus, there has been active work to find a suitable replacement.

There is a growing interest in depositing thin film semiconductors on polymeric or flexible substrates, particularly because these substrates would be more mechanically robust, lighter weight, and allow more economic manufacturing, for example, by allowing roll-to-roll processing. A useful example of a flexible substrate is polyethylene terephthalate that can be provided as a continuous flexible film. In spite of the potential advantages of flexible substrates, there are many problems associated with polymeric substrates when using traditional photolithography during conventional manufacturing, making it difficult to perform alignment of transistor components across typical substrate widths up to one meter or more. Traditional photolithographic processes and equipment may be seriously impacted by the substrate's maximum process temperature, solvent resistance, dimensional stability, water, and solvent swelling, all key parameters in which polymeric substrates are typically inferior to glass substrates.

There also is interest in utilizing lower cost processes for deposition that do not involve the expense associated with vacuum processing and patterning with photolithography. In typical vacuum processing, a large metal chamber and sophisticated vacuum pumping systems are required in order to provide the necessary environment. In typical photolithographic systems, much of the material deposited in the vacuum chamber is removed. The deposition and photolithography processes and equipment have high capital costs and preclude the easy use of continuous web-based systems.

In the past decade, various materials have received attention as a potential alternative to amorphous silicon for use in semiconductor channels of thin film transistors. The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters.

In addition, metal oxide materials can serve as barrier or encapsulation elements in various electronic devices. These materials also require patterning so that a connection can be made to the encapsulated devices.

There is growing interest in combining atomic layer deposition ("ALD") with a technology known as selective area deposition (or "SAD") in which a material is deposited to form a thin film only in those areas that are desired or selected. Sinha et al. [J. Vac. Sci. Technol. B 24 6 2523-2532 (2006)] have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes wherein the selected areas of the surface area are "activated" or surface modified in such a way that the thin film is formed only on the activated areas. There are many potential advantages to selective area deposition techniques, such as eliminating an etch process for film patterning, reduction in the number of cleaning steps required, and patterning of materials which are difficult to etch. One approach to combining patterning and depositing a semiconductor is described in U.S. Pat. No. 7,160,819 (Conley et al) that describes materials for use in patterning zinc oxide on silicon wafers.

A number of materials have been used by researchers as deposition inhibitor materials for selective area deposition. Sinha et al., referenced above, used poly(methyl methacrylate) (PMMA) as a masking layer. In U.S. Pat. No. 7,160,819 (noted above), acetone and deionized water were used, along with other process contaminants as deposition inhibitor materials.

U.S. Patent Application Publications 2009/0081827 (Yang et al.) and 2009/0051740 (Hiroshima) describe the use of crosslinkable organic compounds or polymers, such as organosiloxane polymers, as deposition inhibitor materials, in ALD processes to provide various electronic devices. These crosslinkable materials are generally coated out of organic solvents.

The problem with the processes using organosiloxanes is that such materials are soluble only in aggressive organic solvents. Aside from health and environmental concerns, the use of aggressive organic solvents is difficult in large scale manufacturing processes. Thus, organosiloxanes can be difficult to remove from a substrate after being deposited as deposition inhibitors. There continues to be a need for additional deposition inhibitors that are soluble in a range of environmentally friendly solvents so they can be formulated into "inks" and that are compatible with various patterning techniques used for fabricating various devices using chemical vapor deposition techniques such as ALD.

SUMMARY OF THE INVENTION

The present invention provides a method for forming a patterned thin film, comprising:

providing a substrate;

providing a pattern of a deposition inhibitor to a surface of the substrate, wherein the deposition inhibitor comprises at least one cellulose ester, which pattern comprises inhibitor areas where the deposition inhibitor is present and open areas where the deposition inhibitor is absent; and selectively depositing a first inorganic thin film on the surface of the substrate by a chemical vapor deposition process only in the open areas of the pattern.

This invention also provides a device prepared according to any of the embodiments of the method of the present invention, wherein the device comprises the substrate and the pattern of the deposition inhibitor in the inhibitor areas on the surface of the substrate and the inorganic thin film only in the open areas on the surface of the substrate.

In some other embodiments, the method of this invention can further comprise:

selectively depositing a second inorganic thin film only on the first inorganic thin film in the open areas on the surface of the substrate by a chemical vapor deposition process, thereby forming a two-layer patterned thin film in the open areas on the surface of the substrate, wherein the second inorganic thin film is the same as or different in material composition from the first inorganic thin film.

This method can be used to prepare other devices of the present invention, wherein each of these device comprises the substrate, the pattern of the deposition inhibitor is in the inhibitor areas on the surface of the substrate, and the two-layer patterned thin film is in the open areas on the surface of the substrate.

In some other embodiments, a method comprises selectively depositing the organic thin film by spatially dependent atomic layer deposition comprising:

providing a series of gas channels, each gas channel being in contact with a discrete open areas on the surface of the substrate, and each gas channel having a gas composition, and the series of gas channels comprising, in order, a first reactive gaseous material, an inert purge gas, and a second reactive gaseous material, and optionally repeating this sequence a plurality of times, moving the substrate relative to the gas channels so that a portion of the substrate comes into contact sequentially with at least two gas channels, wherein the first reactive gaseous material is capable of reacting with the surface of the substrate surface that has been treated with the second reactive gaseous material to form the inorganic thin film.

This invention provides a deposition method for forming a patterned inorganic metal oxide thin film on a substrate using a pattern of a deposition inhibitor on a surface of the substrate. The deposition inhibitor comprises at least one (one or more) cellulose ester, and the pattern provided thereby comprises "inhibitor" areas (also known as "closed" areas) where the deposition inhibitor is present and "open" areas where the deposition inhibitor is absent. The inorganic thin film is selectively deposited on the surface of the substrate by a chemical vapor deposition process only in the open areas of the pattern.

The cellulose esters used as deposition inhibitors in the present invention are relatively inexpensive and can be readily formulated into environmentally friendly compositions or inks that can be used in various patterning techniques. Once applied to a substrate, such deposition inhibitors can more readily removed from substrates compared to the known organosiloxanes.

The present invention generally includes selective deposition of metal oxides and other materials as thin films using a chemical vapor deposition process such as ALD system, for example a spatial ALD (SALD) system. The present invention is adaptable for deposition of the deposition inhibitor and think film metal oxides onto a continuous web or other moving substrate, of various sizes. Such methods can advantageously be carried out under convenient conditions such as low or ambient temperatures and pressure in an unsealed environment.

Electronic devices that can be obtained from the method of the present invention include integrated circuits, active-matrix displays, solar cells, active-matrix imagers, sensors, and rf labels.

Other objects, features, and advantages of the present invention will become apparent to those skilled in the art upon a reading of the following detailed description when taken in conjunction with the drawings that show and describe illustrative embodiments of the invention.

BRIEF DESCRIPTION OF THE DRAWINGS

In the detailed description of the certain embodiments of the present invention presented below, reference is made to the accompanying drawings, in which:

FIGS. 4a through 4e are schematic illustrations for making two-layer patterned thin film devices of the present invention using the process of FIG. 3.

DETAILED DESCRIPTION OF THE INVENTION

Figure 1:
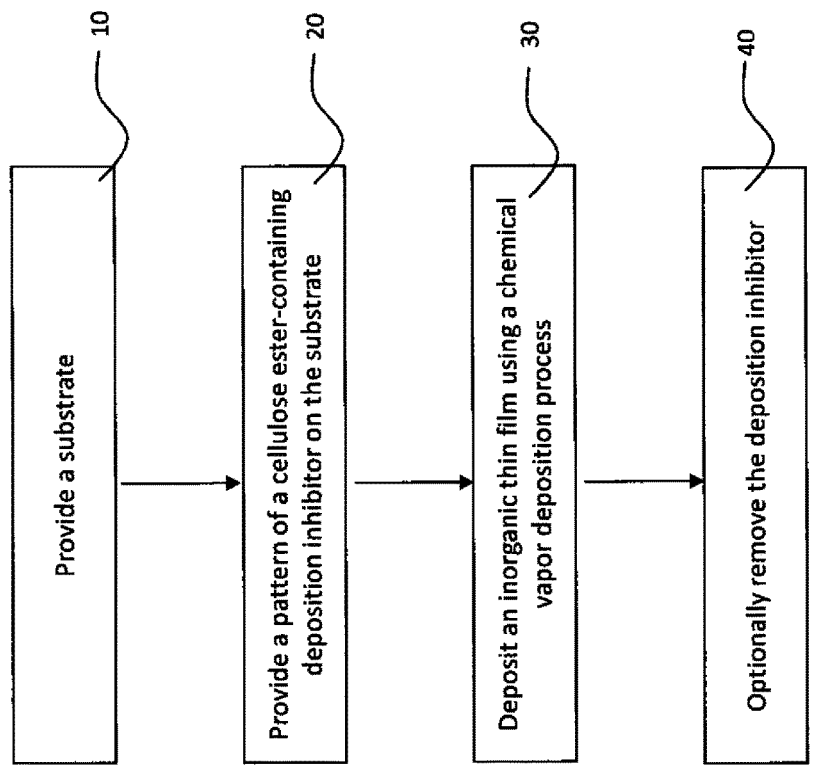
FIG. 1 is a flow chart describing the steps of some embodiments of the present invention.

The following discussion is directed to various embodiments of the present invention and while some embodiments can be desirable for specific uses, the disclosed embodiments should not be interpreted or otherwise considered be limit the scope of the present invention, as claimed below. In addition, one skilled in the art will understand that the following disclosure has broader application than is explicitly described and the discussion of any embodiment.

Definitions

As used herein in the claims and specification to define various components of the deposition inhibitor, secondary polymers, inorganic thin film material, and any other materials used in the practice of the present invention, unless otherwise indicated, the singular forms "a," "an," and "the" are intended to include one or more of the components (that is, including plurality referents).

Throughout the specification and claims, the following terms take the meanings explicitly associated herein, unless the context clearly dictates otherwise. The meaning of "in" includes "in," "on," "therein," and "thereon." Additionally, directional terms such as "on," "over," "top," "bottom," "left," "right" are used with reference to the orientation of the Figure(s) being described. Because components of embodiments of the present invention can be positioned in a number of different orientations, the directional terminology is used for purposes of illustration only and is in no way limiting.

The term "deposition inhibitor" refers herein to the material (or composition) described below that is applied to a substrate surface in a patternwise fashion to provide inhibitor areas where deposition inhibitor resides and open areas where deposition inhibitor is absent, prior to formation of one or more inorganic thin films (described below). Unless otherwise indicated, the terms "deposition inhibitor," "deposition inhibitor material," or "cellulose ester-containing inhibitor" are meant to mean the same thing.

The terms "gas" and "gaseous material" are used in a broad sense to encompass any of a range of elements, compounds, or materials in gaseous or vaporized phase. Other terms used herein such as reactant, precursor, vacuum, and inert gas, for example, all have their conventional meanings as would be well understood by those skilled in the materials deposition art.

The term "inhibitor power" is defined below in the description of the Examples, but the term is not to be interpreted as limited to just those deposition inhibitors and substrates used therein.

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

The present description will be directed in particular to features or components forming part of, or cooperating more directly with, an apparatus in accordance with the present invention. It is to be understood that features not specifically shown, labeled, or described can take various forms well known to those skilled in the art. In the following description and in the accompanying drawings, identical reference numerals have been used, where possible, to designate identical features. It is to be understood that features and components can be referred to in singular or plural form, as appropriate, without limiting the scope of the invention.

The example embodiments of the present invention are illustrated schematically in the Figures and are not to scale for the sake of clarity. One of ordinary skill in the art will be able to readily determine the specific size and interconnections of the features of the example embodiments of the present invention. Therefore, the provided Figures are not drawn to scale but are intended to show overall function and the structural arrangement of some embodiments of the present invention.

Even though specific embodiments of the invention have been described herein, it should be noted that the present invention is not limited to these embodiments. In particular, any features described with respect to one embodiment may also be used in other embodiments, where compatible. The features of the different embodiments can be exchanged, where compatible.

Deposition Methods and Devices

The present invention relates to methods for patterning thin film inorganic materials and to devices (or articles) that contain such patterned inorganic thin films. In particular embodiments, the thin film inorganic materials are deposited onto a suitable substrate using an atomic layer deposition (ALD) process.

Thus, devices of the present invention can be carried out using selective area deposition (SAD) in combination with ALD employing a suitable deposition inhibitor (as defined below) that inhibits the growth of an inorganic thin film material on the substrate when the substrate is subjected to an atomic layer deposition (ALD). The deposition of the inorganic thin film materials is deposited only in selective regions (that is, open areas) on the surface of the substrate where the deposition inhibitor is not present (absent). The deposition inhibitor is the cellulosic polymers described below that can be the only material applied during deposition, or the deposition inhibitor can be provided in a composition in combination with other materials (as described below), any of which materials can be crosslinkable or capable of other chemical reactions that modify the deposition inhibitor or combined materials that may occur prior to depositing an inorganic thin film on the substrate by atomic layer deposition. Crosslinking may occur before, during, or after application of the deposition inhibitor (or composition containing same).

In the present invention the deposition inhibitor is a cellulose ester. Cellulose esters are advantageous in that many of them are soluble in alcohols in low-cost solvent systems, such as those used in flexographic printing. For example, most cellulose acetate butyrate compounds are soluble in esters, ketones, glycol ethers, glycol ether esters, as well as blends of alcohols and aromatic hydrocarbons. Cellulose esters are also advantageously "green" since they are made from a sustainable and renewable resource. Cellulose esters are cellulose-based (or cellulosic) polymers in which at least one of the three hydroxyl groups in an anhydroglucose unit of the cellulose has been derivatized to an ester. Cellulose esters can be classified into cellulose monoesters in which one type of ester group is bonded to cellulose, and cellulose mixed esters in which two or more types of ester groups are present in the cellulose polymer. For example, a representative derivatized anhydroglucose unit can be illustrated as follows:

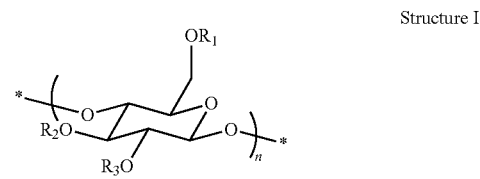

Structure I wherein n represents repeating anhydroglucose units, and $R_1$, $R_2$, and $R_3$ can be hydrogen but at least one of $R_1$, $R_2$, and $R_3$ is an acyl group such as acetyl, propionyl, butyryl, valeryl, or other such group. The substituent acyl groups can be the same (cellulose monoesters) or different (cellulose mixed esters).

Useful cellulose monoesters include but are not limited to, cellulose acetate, cellulose propionate, cellulose butyrate, cellulose valerate, cellulose stearate, and cellulose phthalate. Useful cellulose mixed esters include but are not limited to, cellulose acetate propionate, cellulose acetate butyrate, cellulose acetate valerate, cellulose acetate caproate, cellulose propionate butyrate, and cellulose acetate propionate butyrate.

In general, most useful cellulose esters are "nonionic" cellulose esters so that each molecule has a net neutral charge.

Useful cellulose esters can be further characterized by their degree of substitution (DS), which is the average number of hydroxyl groups per anhydroglucose ring that have been derivatized to ester groups. Values of DS for cellulose esters useful in the present invention thus must be greater than 0 and up to and including 3. For example, useful cellulose esters can have DS values of at least 0.5 or more likely at least 0.5 and up to and including 2.9, or even at least 1 and up to and including 2.5.

Molecular weights for useful cellulose esters can be at least 2,000 Daltons and up to and including 2,000,000 Daltons, or at least 10,000 Daltons and up to and including 100,000 Daltons, or more likely at least 25,000 Daltons and up to and including 75,000 Daltons.

It is to be understood that of the cellulose esters described herein, not every cellulose ester may perform optimally, but that a skilled artisan would be able to use routine experimentation to obtain the best cellulose ester for a desired use (for example, for a particular substrate). Of the representative materials, cellulose acetate, cellulose acetate propionate, and cellulose acetate butyrate are particularly useful as deposition inhibitors. A mixture of two or more cellulose esters can also be used in the practice of this invention.

The deposition inhibitor can be provided and used as the only material in the practice of this invention, that is, a single cellulose or a mixture thereof, can comprise 100 weight % of the material that is deposited on the substrate (described below).

However, in many instances, the deposition inhibitor is provided in a composition in which at least one cellulose ester comprises at least 0.25 weight %, or at least 0.25 weight % and up to and including 5 weight %, or even at least 0.5 weight % and up to and including 2 weight %, based on the total composition weight (including a solvent medium). Such composition can then be used for deposition upon a suitable substrate (described below).

In such embodiments, the one or more cellulose esters can be dissolved or dispersed in a solvent medium comprising one or more solvents that include but are not limited to, certain alcohols (such as methanol, ethanol, and isopropyl alcohol), ketones (such as acetone, methyl ethyl ketone, cyclohexanone, and diacetone alcohol), glycol ethers (such as ethylene glycol monomethyl ether, propylene glycol monopropyl ether, propylene glycol monotertiary butyl ether, ethylene glycol monoethyl ether, ethylene glycol monobutyl ether, diethylene glycol monoethyl ether, diethylene glycol monobutyl ether, diethylene glycol diethyl ether, triethylene glycol monobutyl ether, and dipropylene glycol monomethyl ether), glycol ether esters (such as ethylene glycol monoethyl ether acetate and ethylene glycol diacetate), methylene chloride, tetrahydrofuran (THF), nitrogen-containing solvents (such as dimethyl formamide, 2-pyrrolidone, and N-methyl-2-pyrrolidone), and esters (such as ethyl acetate, isopropyl acetate, n-propyl acetate, n-butyl acetate, and n-butyl propionate). A given cellulose ester useful in the present invention is considered soluble in a particular solvent medium if it can be dissolved in an amount of 10 weight %. Not every cellulose ester will necessarily be soluble or dispersible in every solvent of this type.

It can be particularly advantageous that the one or more cellulose esters are used in a composition comprising at least one polymer that comprises in its backbone, side chains, or both its backbone or sides chains, multiple secondary or tertiary amide groups represented by the structure —NH—C(=O)— or >N—C(=O)—. In some embodiments, at least some of the acetamide groups are recurring and form at least part of the secondary polymer backbone through the nitrogen atom. In other embodiments, at least some of the acetamide groups are on side chained of the secondary polymer and are represented by the structure —N(R)—C(=O)—R' wherein R is hydrogen or an alkyl, cycloalkyl, or aryl group and R' is an alkyl, cycloalkyl, or aryl group. Further details of such useful secondary polymers are provided in U.S. Pat. No. 8,168,546 (Levy), the disclosure of which is incorporate herein by reference.

Useful secondary polymers can be derived by suitable polymerization procedures from one or more of a vinyl pyrrolidone, N-vinyl acetamide, and 2-ethyl-2-oxazoline). Such secondary polymers can be homopolymers derived from each of these ethylenically unsaturated polymerizable monomers, copolymers derived from two or more of such ethylenically unsaturated polymerizable monomers, or copolymers derived from one or more of these ethylenically unsaturated polymerizable monomers and one or more other ethylenically unsaturated polymerizable monomers having none of the noted secondary or tertiary amide groups.

Some useful secondary polymers are vinyl pyrrolidone polymers including both homopolymers derived from a vinyl pyrrolidone monomer (such as vinyl 2-pyrrolidone), or copolymers derived in part from a vinyl pyrrolidone monomer. A particularly useful secondary polymer is poly(vinyl 2-pyrrolidone) having a molecular weight of about 30,000.

In some embodiments, the deposition inhibitor comprises a mixture of at least one cellulose ester (such as a nonionic cellulose ester) and at least one secondary polymer in a weight ratio of from 0.1:1 to and including 10:1. Thus, such embodiments can comprise at least one cellulose ester and at least one secondary polymer in a solvent medium described above.

The deposition inhibitor described above can be applied to a surface of the substrate (described below) to inhibit thin film growth of a chemical vapor deposition process, such as CVD or particularly ALD as described above. After application to the substrate, the deposition inhibitor is typically dried to form a thin film layer containing the cellulose ester and optional secondary polymer. To form a patterned inorganic thin film, the deposition inhibitor is provided in a pattern on the substrate having regions (inhibitor areas) containing the deposition inhibitor and open areas where the substrate is still exposed, that is where the deposition inhibitor is absent. The substrate surface with the deposition inhibitor pattern can be subjected to a chemical vapor deposition process. Although the entire substrate surface having the pattern "sees" the chemical vapor deposition process, the inorganic thin film (described below) is selectively deposited on the surface of the substrate by a chemical vapor deposition process only in the open areas of the pattern. There is no thin film deposition upon the deposition inhibitor, as its function is to inhibit such deposition or growth.

Deposition of the deposition inhibitor can be provided in a patternwise manner using any of a variety of techniques that would be apparent to one skilled in the art including but not limited to, inkjet printing, flexographic printing, gravure printing, microcontact printing, photolithographic printing, offset lithography, patch coating, screen printing, or transfer from a donor sheet.

In alternative embodiments, a uniform layer of the deposition inhibitor can be deposited on the surface of the substrate followed by pattern formation in this uniform layer by removing portions of the uniform layer of the deposition inhibitor to form open areas on the substrate and leaving the deposition inhibitor in the inhibitor areas only, for example as described below in the description of step 40 of FIG. 1.

For best use a deposition inhibitor in a manufacturing process, it is desirable that the thickness of the resulting deposition inhibitor layer be as thin as possible while still having sufficient inhibition effectiveness. For example, it is desirable that the layer of deposition inhibitor in the resulting layer have a dry thickness of no more than 1000 Å, or no more than 500 Å and in most embodiments, the dry layer thickness is under 200 Å. Typically, the layer of deposition inhibitor has a minimum dry thickness of at least 20 Å.

In some embodiments, the deposition inhibitor is chosen specifically for the inorganic thin film material to be deposited. For example, the deposition inhibitor can be chosen to have a given inhibition power, which is defined as the dry layer thickness at or below which the deposition inhibitor material is effective to keep the inorganic thin film material from being deposited in the inhibitor areas. For example, it is useful for the deposition inhibitor material, during use, to exhibit an inhibition power of at least 50 Å, or at least 100 Å, or even at least 300 Å on the surface of the substrate.

The cellulose esters, secondary polymers, and solvent media described above for the present invention can be individually obtained from various commercial sources or prepared using know sources or reaction procedures using known starting materials and reaction conditions.

Atomic Layer Deposition (ALD) is the most useful chemical vapor deposition process for carrying out the present invention. ALD is a process that is used to produce coatings with thicknesses that can be considered consistent, uniform, or even exact. ALD produces organic thin film coatings that can be considered conformal or even highly conformal material layers. Generally described, an ALD process accomplishes inorganic thin film deposition by exposing the substrate (having both open areas and inhibitor areas in the pattern of deposition inhibitor) to alternate cycles of two or more reactive materials, commonly referred to as precursors. Traditional ALD systems are chamber based, and operate under vacuum. In a typical process, a first precursor is applied to react with the substrate, followed by the removal of the excess of the first precursor from the vacuum chamber. Next, a second precursor is applied to react with the first precursor on the substrate, followed by the removal of the excess of the second precursor from the vacuum chamber. This process is repeated as many times (or cycles) as necessary to build up the inorganic thin film thickness with each reaction occurring only at the substrate surface in the open areas of the pattern.

ALD can be performed at or near atmospheric pressure and over a broad range of temperatures, and generally at less than 300° C. A spatial ALD process can be used. This process, commonly referred to as S-ALD or simply SALD, is described in at least one of U.S. Pat. No. 7,413,982 (Levy); U.S. Pat. No. 7,456,429 (Levy); U.S. Pat. No. 7,789,961 (Nelson et al.); and U.S. Pat. No. 8,318,249 (Levy); and U.S. Patent Application Publication 2009/0130858 (Levy), the disclosures of all of which are incorporated by reference in their entirety.

SALD produces inorganic thin film coatings having dry thicknesses that can be considered consistent, uniform, or even exact. SALD produces inorganic thin film coatings that can be considered conformal or even highly conformal material layers. SALD is also compatible with a low temperature coating environment. Additionally, SALD is compatible with continuous web coating processes, making it attractive for large-scale production operations. Even though some continuous web coating operations may experience alignment problems, for example, web tracking or stretching problems, the transistor architectures of some embodiments of the present invention can reduce reliance on high resolution or very fine alignment features during the manufacturing process. Therefore, SALD is well suited for continuous manufacturing operations for the present invention. The various details for continuous manufacturing operations are described for example in U.S. Pat. No. 8,318,249 (noted above). In some of such operations, one or more inorganic thin films can be selectively deposited while moving the substrate (that can comprise a flexible continuous film) relative to a deposition device at a speed of at least 0.1 cm/sec. Such relative movement can oscillating, reciprocating, or continuously linear in motion. Moreover, a delivery head used during deposition of an inorganic thin film material can be maintained close to the substrate surface, for example, within 0.5 mm, or even less than 0.2 mm or within 0.1 mm of the substrate surface.

Atomic layer deposition can be used in the present invention to form a variety of inorganic thin films that comprise one or more metals or metal-containing compounds. Useful metal-containing compounds include for example (with respect to the Periodic Table) a Group V or Group VI anion. Such metal-containing compounds include but are not limited to oxides, nitrides, sulfides or phosphides of such metals as zinc, aluminum, titanium, hafnium, zirconium or indium, or combinations thereof.

Oxides that can be formed using the present invention include, but are not limited to: zinc oxide (ZnO), aluminum oxide ($Al_2O_3$), hafnium oxide, zirconium oxide, indium oxide, tin oxide, and other metal oxides that would be readily apparent to one skilled in the art. Mixed structure oxides that can be formed using the present invention can include but are not limited to InZnO. Doped materials that can be formed using the present invention can include but are not limited to ZnO:Al, $Mg_xZn_{1-x}O$ (wherein x is a technically possible number), and LiZnO.

A dielectric material is any material that is a poor conductor of electricity. Such materials typically exhibit a bulk resistivity greater than $10^{10}$ Ω-cm. Examples of dielectrics include $SiO_2$, HfO, ZrO, SiNx, and $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, and gallium arsenide, or zinc oxide, indium zinc oxide, and gallium indium zinc oxide. The semiconductors can be doped to render them n-type or p-type, or to modulate the number of charge carriers present.

The substrates used in the present invention can be any material that acts as a mechanical support for the sequentially deposited layers. The substrate can include a rigid material such as glass, silicon, or metal. Useful substrate materials can be composed of organic or inorganic materials. Flexible supports or substrates also can be used in the present invention. Nominally rigid materials that are flexible due to their thinness can also be used. These include glasses at thicknesses at or below 200 µm and metals with thicknesses at or below 500 µm.

The substrate can be bare indicating that it contains no substantial materials on its surface other the material from which it is composed. Alternatively, the substrate can include various layers on the surface including subbing layers, adhesion layers, release layers, wetting layers, hydrophilic layers, or hydrophobic layers. Thus, the substrate can comprise a plurality of material layers before the deposition inhibitor and inorganic thin film are applied. The substrate surface can be treated in order to promote various properties such as adhesion. These treatments include plasma treatments, corona discharge treatments, and chemical treatments.

The substrate can also include patterned materials on one or its surface. Such patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

The production of inorganic thin film transistors and electronic devices from semiconductor, dielectric, conductive materials can be accomplished by using the present invention. The exact patterned layer sequence is determined by the structure of the desired transistor. Thus, in the production of a field effect transistor in a so-called inverted structure, a gate electrode can be first formed on a substrate. The gate electrode is insulated with a dielectric material and the source and drain electrodes and a layer of the inorganic semiconductor material are applied on top. The structure of such a transistor, and hence the sequence of its production, are varied in the customary manner known to a person skilled in the art. Alternatively, a gate electrode is deposited first, followed by a gate dielectric, the semiconductor material is applied, and finally the contacts for the source electrode and drain electrode are deposited on the semiconductor layer. In most embodiments, a field effect transistor includes an insulating layer, a gate electrode, a semiconductor layer including an inorganic material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer and the source electrode and the drain electrode both contact the semiconductor layer. Each of these types of devices can be formed using the process of the present inventions. In some embodiments it is particularly useful to pattern all of the layers of the transistor using the SAD process according to the present invention using the deposition inhibitor described above.

Turning now to the Figures that illustrate the present invention, FIG. 1 is a diagrammatic flow chart for one embodiment of the present invention for making a patterned inorganic thin film using a cellulose ester-containing deposition inhibitor as described above. As shown in Step 10, a substrate is provided for the process, which substrate can be any material as described above. Next, Step 20 provides a pattern of a cellulose ester-containing deposition inhibitor on a surface of the substrate, which substrate can optionally be treated prior to this step as described above, including wet cleaning, oxygen plasma, or UVO treatments.

As noted above, the pattern of deposition inhibitor can be provided in Step 20 using an additive patterning process, such as using inkjet printing, flexographic printing, gravure printing, microcontact printing, offset lithography, patch coating, screen printing, or transfer from a donor sheet. In an alternative embodiment, Step 20 can be carried out by depositing a uniform layer of the deposition inhibitor on the surface of the substrate, which is then subsequently patterned by removing portions of the uniform layer of deposition inhibitor to form a pattern of the cellulose ester-containing deposition inhibitor. The resulting pattern of cellulose ester-containing deposition inhibitor provides open areas where the cellulose ester-containing deposition inhibitor is absent and inhibitor areas where cellulose ester-containing deposition inhibitor is present.

Continuing with FIG. 1, in Step 30 a desired inorganic thin film can be provided by depositing a deposition inhibitor material by a chemical vapor deposition process such as the Atomic Layer Deposition (ALD) process described above including a spatial ALD system. The inorganic thin film material is generally deposited only in the open areas of the substrate where there is no deposition inhibitor material. The inorganic thin film material deposited in Step 30, is therefore patterned at the time of deposition by being deposited only in the open areas on the surface of the substrate. The inorganic thin film material can have any composition previously discussed, such as a metal oxide such as zinc oxide.

Depending on the use of the inorganic thin film, after selectively depositing it (for example, a first inorganic thin film), the deposition inhibitor can be kept on the substrate for subsequent processing or it can be removed from the inhibitor areas as shown in Step 40 of FIG. 1. For example, the deposition inhibitor can be removed from the inhibitor areas on the substrate by a liquid process using a solvent, in which the deposition inhibitor is soluble such as an ester or ketone (as described above), or a detergent-containing solution. The deposition inhibitor can also be removed using a vapor process where the device containing the inorganic thin film is exposed to a vapor reactant that causes removal of the deposition inhibitor. Such deposition inhibitor removal can occur spontaneously upon reaction with the vapor, resulting in the conversion of the deposition inhibitor to a volatile species. Alternatively, the vapor exposure can react with the deposition inhibitor, converting it to another species or morphology that is then more easily removable with another process, such as a liquid process. The vapor exposure can include forms of energy to promote the process. These energy sources can include light exposure, arcs, or plasmas. Particularly desired light exposure include UV radiation exposure especially in the presence of oxygen to produce ozone. Useful plasmas include plasmas of various species including oxygen, chlorine, or fluorine. Use of plasmas created with these materials or with precursors that produce these materials is included in the practice of the present invention.

Figure 2A:
FIGS. 2a through 2d are schematic illustrations for making devices with selective thin layer devices of the present invention using the process illustrated in FIG. 1.
Figure 2B:
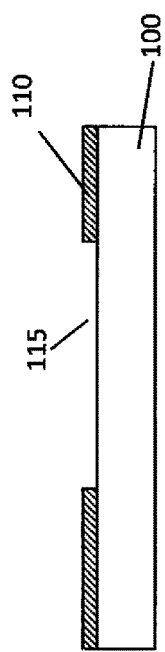
Figure 2C:
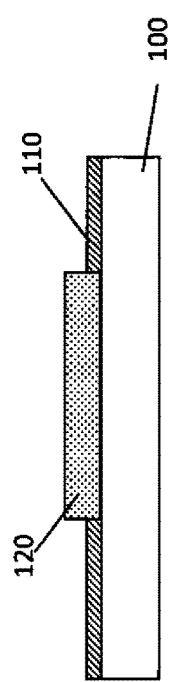
Figure 2D:
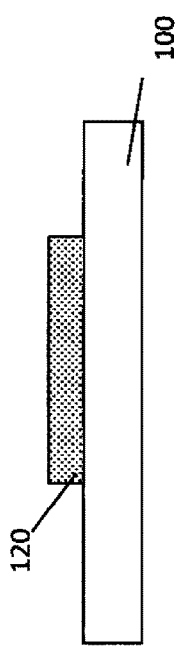

The process illustrated in FIG. 1 can be better understood through the process illustrated in FIGS. 2a through 2d. In FIG. 2a, substrate 100 is provided as in Step 1 of FIG. 1. FIG. 2b shows the pattern of deposition inhibitor layer 110 on substrate 100, which pattern comprises at least one cellulose ester (and optionally at least one secondary polymer). The pattern forms open areas 115 where the deposition inhibitor is absent and inhibitor areas (not shown) underneath the deposition inhibitor. FIG. 2c illustrates the result of Step 30 of FIG. 1, namely the patterned inorganic thin film 120 deposited in the open areas 115 using a chemical vapor deposition process such as an ALD process. The deposition inhibitor 110 is optionally removed as shown in Step 40 of FIG. 1 and its absence is illustrated in FIG. 2d where the inhibitor areas are now "open." The inhibition power of deposition inhibitor 110 can be defined as the thickness of the deposited inorganic thin film layer that can be formed in open areas 115 before the onset of significant inorganic thin film material deposition in the inhibitor areas having deposition inhibitor 110.

Figure 3:
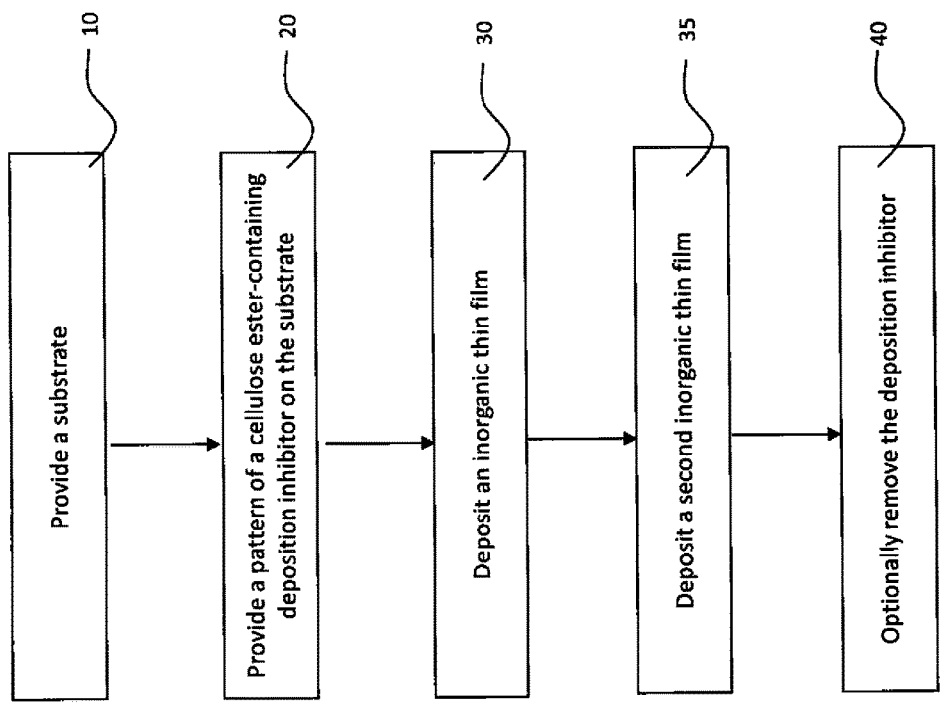
FIG. 3 is a flow chart describing the steps of additional embodiments of the present invention.

FIG. 3 is a flow chart for another embodiment of the present invention for making a multi-layer patterned inorganic thin film layer using a combination of selected area deposition (SAD) with a cellulose ester-containing deposition inhibitor and an ALD process. Steps 10, 20 and 30 are the same as described in FIG. 1 and should be understood from the previous description. The inorganic thin film deposited in Step 20 is considered in such embodiments at the "first" inorganic thin film composed of a "first" inorganic thin film material.

In Step 35, a second inorganic thin film layer is selectively formed by a chemical vapor deposition process. The patterned cellulose ester-containing deposition inhibitor inhibits the deposition of the second inorganic thin film material so that it is deposited only where the deposition inhibitor is absent. Hence, the second inorganic thin film is deposited essentially exactly on the "first" inorganic thin film. The selective deposition of the second inorganic thin film uses the same pattern used to pattern the first inorganic thin film that was deposited in Step 30. The result of Step 35 is to provide a patterned two-layer inorganic thin film stack in the open areas of the pattern provided by the deposition inhibitor.

After selective deposition of the second inorganic thin film layer, the patterned deposition inhibitor can optionally be removed from the inhibitor areas as shown in Step 40 using any suitable process known in the art, as described for the processes described in reference to FIG. 1.

FIGS. 4a through 4e represent a schematic diagram for an embodiment of the present invention for producing an inorganic multi-layered (for example, patterned two-layer) thin film structure in the open areas on the surface of the substrate using a combination of selected area deposition (SAD) and ALD and the process described in FIG. 3. In FIG. 4a, substrate 300 is provided as in Step 1 of FIG. 3. FIG. 4b shows the patterned cellulose ester-containing deposition inhibitor 330 and the resulting patterned cellulose ester-containing deposition inhibitor 330 provides closed areas (not shown) and open areas 335 where the cellulose ester-containing deposition inhibitor is absent.

A first inorganic thin film material 340 is deposited as in Step 30 of FIG. 3 by treating the substrate surface to an ALD coating such that the first inorganic thin film is formed only in open areas 335 where the cellulose ester-containing deposition inhibitor 330 is absent as shown in FIG. 4c. FIG. 4d shows the result of deposition of a second inorganic thin film 345 as in Step 35 of FIG. 3 by an Atomic Layer Deposition (ALD) process on the substrate, resulting in patterned second inorganic thin film 345 in the same open areas 335 as the first inorganic thin film 340 and little to no deposition of the second inorganic thin film material in inhibitor areas covered by cellulose ester-containing deposition inhibitor 330. The resulting inorganic multi-layered thin film structure 350 now includes a stack of first and second inorganic thin films represented in order by 340 and 345. FIG. 4e shows multi-layered thin film structure 350 after an optional removal of cellulose ester-containing deposition inhibitor as in Step 40 of FIG. 3, leaving substantially only the inorganic multi-layered thin film structure on the original substrate 300.

First inorganic thin film 340 and second inorganic thin film 345 can have the same or different material compositions. The difference in material composition can include differences in one or more of the atomic constituents that compose the respective inorganic thin films. Alternatively, the difference in compositions can be only a change in the atomic ratio of the constituents that compose the inorganic thin films.

For example, first inorganic thin film 340 can comprise a dielectric material and second inorganic thin film material layer 345 can comprise a semiconductor material, wherein selectively depositing the second inorganic thin film material layer includes selectively depositing the second inorganic thin film material layer directly on the first inorganic thin film material layer after the first inorganic thin film material layer has been deposited in the open areas on the surface of the substrate. Alternatively, first inorganic thin film 340 can comprise a semiconductor material and second inorganic thin film 345 can comprise a dielectric material.

The following Examples are provided to illustrate the practice of the present invention but they are not meant to be limiting in any manner.

General Conditions for the Preparation of Layers Using Spatial ALD (SALD)

The preparation of patterned inorganic thin films on silicon substrates is described in the following working example. The ALD coating device used to prepare the inorganic thin layers comprising aluminum oxide, zinc oxide, and Al-doped ZnO (AZO), has been described in detail in commonly assigned US Patent Application Publication 2009/0130858 (noted above), the disclosure of which is incorporated herein by reference in its entirety. The ALD coating device had an output face (facing up) that contained spatially separated elongated gas channels and operated on a gas bearing principle. The ALD coating device can be understood with respect to representative delivery head 900 shown in FIG. 5. Each gas channel is composed of output slots 95, 93, 92 that supplies gas to output face 905, and adjacent exhaust or vacuum slots 910 that remove gases from output face 905. The order of the gas channels is P-O-P-M-P-O-P-M-P-O-P where P represents a purge channel, O represents a channel containing an oxygen based precursor (oxidizer), and M represents a channel containing a metal-containing precursor (such as a precursor to an inorganic thin film material). The gas flows from delivery head 900 additionally act to maintain a gap 99 between substrate 97 and delivery head 900. As substrate 97 can move relative to delivery head 900 as indicated by arrow 98, it is contacted by the noted sequence of gases which results in ALD inorganic thin film deposition.

A 2.5×2.5 inch square (62.5 mm square) glass substrate attached to a heated backer was positioned above the output face of the ALD coating device and was maintained in close proximity to the output face 905 by an equilibrium between the pull of gravity, the flow of the gases supplied to output face 905, and a slight amount of vacuum produced at the exhaust slot. For all of the examples described below, the exhaust slot pressure was approximately 40 inches of water below atmospheric pressure. The purge gas P was composed of pure nitrogen. The oxygen reactive precursor O was a mixture of nitrogen, water vapor, and optionally ammonia vapor. The metal reactive precursor M was one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the ALD coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the inorganic thin film coating was established by controlling heating of both the ALD coating device and the backer to a desired temperature. Experimentally, the flow rates of the individual gasses were adjusted to the settings shown in TABLE I (wherein "sccm" represents standard cubic centimeter per minute) for each of the deposited materials in the examples contained herein. The flows shown are the total flows supplied to the ALD coating device, and thus are partitioned equally among the individual gas channels.

The coating process was then initiated by oscillating the substrate 97 across delivery head 900 for the number of cycles necessary to obtain a uniformly deposited inorganic thin film of the desired thickness for the given example. Delivery head 900 as described above contained two full ALD cycles (two oxygen and two metal exposures per single direction pass over the head), therefore a round trip oscillation represented 4 ALD cycles. All samples were provided while keeping the substrate at 200° C.

bition power of a selected deposition inhibitor is defined as the amount of inorganic thin film formation (thickness) that would have occurred in the absence of the deposition inhibitor prior to the onset of growth on a substrate that is coated with the same deposition inhibitor. A higher inhibition power indicates a more effective deposition inhibitor.

Figure 5:
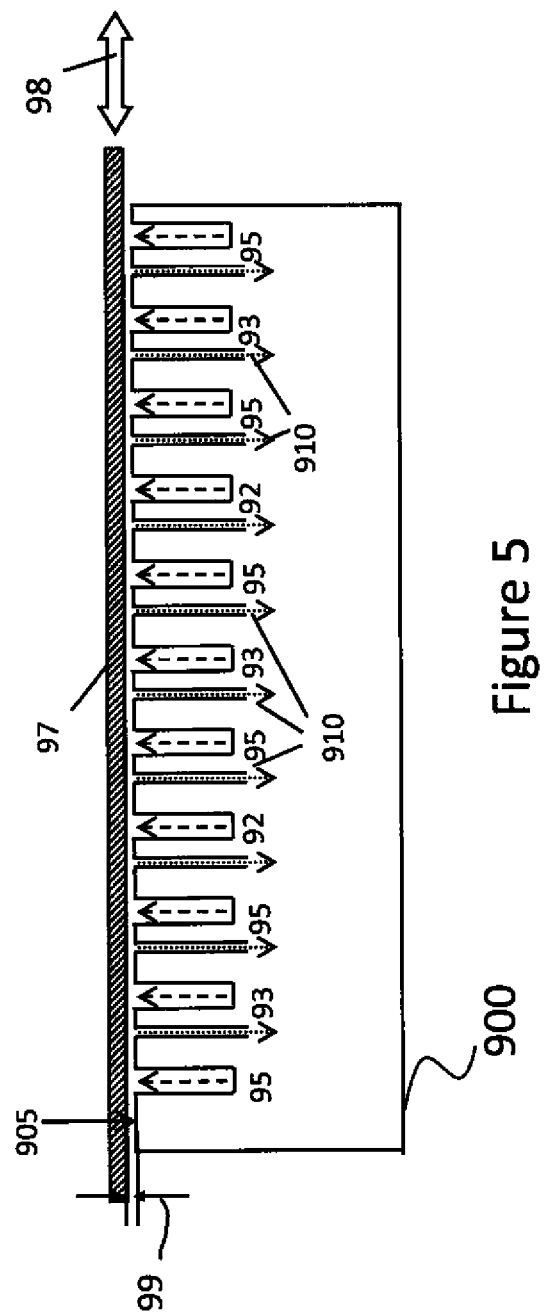
FIG. 5 is a cross-sectional side view of a deposition device for atomic layer deposition that can be used in the present invention, as explained further in the working Examples described below.

To measure the inhibition power, a silicon substrate was spin coated with a cellulose ester deposition inhibitor composition and then baked in air to ensure complete removal of the solvent medium. The resulting dry film thickness was evaluated using ellipsometry. The silicon substrate used in the inhibition power test was then subjected to an ALD process using a gas bearing ALD delivery head as described in U.S. Patent Application Publication 2009/0130858 (noted above) and like that illustrated in FIG. 5. The delivery head contained regions for a metal precursor, and oxygen precursor, and inert purge or separator gases as illustrated in FIG. 5.

To test various deposition inhibitors, zinc oxide film growth at 200° C. was used with the conditions of TABLE I. The substrate speed relative to the delivery head yielded a channel residence time (thus single precursor exposure time) of 50 milliseconds (the same for all precursor and inert gaseous streams). The desired film thickness of ZnO in these tests was 750 Å; therefore the samples were subjected to 100 oscillations or 400 cycles of ALD growth of ZnO. Dry thickness of the resulting ZnO layers on top of the deposition inhibitor was determined by ellipsometry. Since a fixed number of cycles (400) was used in the evaluation, samples that showed no growth on the deposition inhibitor under these conditions have a minimum inhibition power of 750 Å.

Use of Cellulose Esters for ZnO Inhibition

Various cellulose esters were tested for selective area inhibition as shown below in TABLE II. Each cellulose material-containing composition (deposition inhibitor and

TABLE I

| Thin Film Material | DMAI bubbler flow (sccm) | DEZ bubbler flow (sccm) | NH₃ flow (sccm) | Water bubbler flow (sccm) | N₂ dilution with metal alkyl (sccm) | N₂ dilution with water (sccm) | N₂ purge (sccm) |
|---|---|---|---|---|---|---|---|
| Al₂O₃ | 65 | 0 | 0 | 65 | 1500 | 2250 | 3000 |
| ZnO | 0 | 60 | 0 | 45 | 1500 | 2250 | 3000 |
| AZO | 10 | 30 | 0 | 22.5 | 1500 | 2250 | 3000 |

Measurement of Inhibition Power:

When a substrate surface containing no deposition inhibitor is subjected to ALD deposition, film growth occurs immediately upon commencement of the ALD exposure cycles. Alternatively, when a deposition inhibitor is present on a surface, initial application of ALD exposure cycles leads to no film growth. However, most deposition inhibitors do not inhibit perfectly (or completely). Thus, after continued application of ALD exposure cycles, there can be an onset of inorganic thin film growth on inhibitor areas containing the deposition inhibitor. As defined above, the inhisolvent medium) was spin coated at 3000 rpm on a silicon substrate: the deposited composition was removed from V₂ of the silicon substrate by wiping it off using an appropriate solvent (to form an "open" area); followed by a hotplate baking at 210° C. to remove the residual solvent medium from the remaining deposition inhibitor composition and to ensure that the resulting deposition inhibitor film could withstand the SALD deposition temperature of 200° C. TABLE 11 also shows the deposition inhibitor composition concentration and resulting dry film thickness (certain thicknesses were estimated based upon previous measurements).

TABLE II

| Example | Cellulose Material | Cellulose Material Type | Solvent Medium | Weight % Cellulose Ester | Deposition Inhibitor Film Thickness (Å) | ZnO Thin Film Thickness (Å) After 400 Cycles | Good inhibitor? |
|---|---|---|---|---|---|---|---|
| Invention 1 | CAP (cellulose acetate propionate) | Nonionic ester | Diacetone alcohol | 1 | 267.25 | 0 | yes |

TABLE II-continued

| Example | Cellulose Material | Cellulose Material Type | Solvent Medium | Weight % Cellulose Ester | Deposition Inhibitor Film Thickness (Å) | ZnO Thin Film Thickness (Å) After 400 Cycles | Good inhibitor? |
|---|---|---|---|---|---|---|---|
| Invention 2 | CA cellulose acetate | Nonionic ester | Diacetone alcohol | 1 | 263.98 | 27 | moderate |
| Comparative 1 | Hydroxypropyl methyl cellulose | Ether | Water | 1 | 190.77 | 603 | poor |
| Comparative 2 | CMC 250k (Carboxymethyl cellulose) | Ether | Water | 1 | 1185.01 | 796 | no |
| Comparative 3 | CMC low viscosity (Carboxymethyl cellulose) | Ether | Water | 1 | 359.28 | 701 | no |
| Invention 3 | Cellulose acetate butyrate (CAB) | Nonionic ester | Diacetone alcohol | 1 | 305.04 | 0 | yes |
| Comparative 4 | Ethyl cellulose | Ether | Toluene | 1 | 460.55 | 708 | no |

TABLE II shows the results from use of the various cellulose-based materials as deposition inhibitors. From these data, it can be seen that water-soluble hydroxypropyl methyl cellulose (Comparative Example 1) exhibited poor deposition inhibition. Carboxymethyl cellulose (Comparative Examples 2 and 3), an ether derivative that is water soluble exhibited very poor deposition inhibition. Ethyl cellulose (Comparative Example 4), while not water soluble, contains a large number of accessible hydroxyl groups and behaved similarly. In contrast, the non-ionic cellulose ester derivatives, showed excellent inhibition.

Use of Mixture of Cellulose Ester and Secondary Polymer

Another aspect of the present invention is the use of deposition inhibitor compositions comprising a cellulose ester and a secondary polymer. This was demonstrated by forming a composition containing a 50/50 mixture of cellulose acetate butyrate (CAB-381-0.5 available from Eastman Chemical) and poly(vinyl pyrrolidone) k30 (PVP) secondary polymer at 1 weight % total polymers in diacetone alcohol. The resulting deposition inhibitor films were tested for selective area inhibition as shown below in TABLE III. Invention Examples 4 through 6 were prepared using the procedure described for Invention Example 1 above. For Invention Example 7, the 1% 50/50 PVP/CAB solution was printed on to a silicon substrate using a Fuji Dimatix 2500 piezo-inkjet printer using a pixel size of 70 μm. The deposition inhibitor "ink" was a printed in a pattern containing large open areas for inorganic thin film growth on the substrate, and large and small inhibitor areas of the deposition inhibitor. TABLE II contains the details from the four examples.

Three primary components useful in building electronic devices were evaluated. All inorganic thin film growth was carried out at 200° C. while using the conditions of TABLE I. The substrate speed yielded a channel residence time (thus ALD exposure time) of 50 milliseconds (the same for all precursor and inert streams). The desired inorganic thin film thickness varied by material and is recorded in TABLE III. Invention Example 4 demonstrated the ability to inhibit the growth of ZnO semiconductor using DEZ. Invention Example 5 demonstrated the ability to inhibit the growth of alumina dielectric using DMAI as an aluminum-containing precursor, and Invention Example 6 demonstrated the ability to inhibit the growth of AZO conductor from the cooperative flows of the metal-containing precursors DEZ and DMAI. Inorganic thin film growth was evaluated using ellipsometry. All Invention Examples 4 through 6 showed the ability to inhibit useful thickness of inorganic thin film growth according to the present invention. Invention Example 7 illustrates that when a pattern of a deposition inhibitor was provided by an additive patterning method, growth of inorganic thin film was inhibited.

TABLE III

| Example | Inhibitor Film Thickness | Inorganic Thin Film Material | Inorganic Thin Film Thickness (Å) | Inorganic Thin Film Growth on Deposition Inhibitor? |
|---|---|---|---|---|
| Invention 4 | 232.56 | ZnO | 691.86 | no |
| Invention 5 | 226.22 | $Al_2O_3$ | 585.51 | no |
| Invention 6 | 219.05 | AZO | 1049.99 | no |
| Invention 7 | Not available; inkjet printed | AZO | 1041.68 | no |

The invention has been described in detail with particular reference to certain preferred embodiments thereof, but it will be understood that variations and modifications can be effected within the spirit and scope of the invention.

PARTS LIST 10 step for providing substrate
20 step for providing a pattern of deposition inhibitor
30 step for selectively depositing inorganic thin film
35 step for selectively depositing second inorganic thin film
40 step for optionally removing deposition inhibitor
92 metal precursor flow
93 oxidizer-containing flow
95 nitrogen purge flow
97 substrate
98 arrow showing relative movement of substrate
99 gap
100 substrate
110 applied deposition inhibitor over inhibitor areas (not shown)
115 open area wherein deposition inhibitor is absent 120 patterned inorganic thin film in open area
300 substrate
330 applied deposition inhibitor over inhibitor areas (not shown)
335 open area where deposition inhibiting is absent
340 patterned first inorganic thin film material in open area
345 patterned second inorganic thin film material
350 multi-layered inorganic thin film structure
900 delivery head
905 output face
910 exhaust channels

The invention claimed is:

1. A method for forming a patterned thin film, comprising:
providing a substrate;
providing a pattern of a deposition inhibitor on a surface of the substrate, wherein the deposition inhibitor comprises at least one cellulose ester and at least one secondary polymer comprising in its backbone, side chains, or both its backbone or sides chains, multiple secondary or tertiary amide groups represented by the structure —NH—C(=O)— or >N—C(=O)—, which pattern comprises inhibitor areas where the deposition inhibitor is present and open areas where the deposition inhibitor is absent; and
selectively depositing a first inorganic thin film on the surface of the substrate by a chemical vapor deposition process only in the open areas of the pattern and not on the pattern of the deposition inhibitor.

2. The method of claim 1, comprising providing the deposition inhibitor in a composition comprising at least 0.25 weight % of the at least one cellulose ester, based on the total weight of the composition.

3. The method of claim 1, wherein the at least one cellulose ester is at least one nonionic cellulose ester.

4. The method of claim 3, wherein the at least one nonionic cellulose ester is selected from cellulose acetate, cellulose acetate propionate, and cellulose acetate butyrate.

5. The method of claim 1, wherein the at least one secondary polymer is a vinyl pyrrolidone polymer.

6. The method of claim 1, wherein the at least one cellulose ester and the at least one secondary polymer are present in a weight ratio of from 0.1:1 to and including 10:1.

7. The method of claim 1, comprising providing the pattern of the deposition inhibitor on the surface of the substrate using inkjet printing, flexographic printing, gravure printing, or photolithographic printing.

8. The method of claim 1, comprising providing a uniform layer of the deposition inhibitor on the surface of the substrate, and removing portions of the uniform layer of the deposition inhibitor to provide the open areas and leaving the deposition inhibitor only in the inhibitor areas.

9. The method of claim 1, wherein the substrate comprises a plurality of material layers.

10. The method of claim 1, comprising selectively depositing the first inorganic thin film using an atomic layer deposition process.

11. The method of claim 10, wherein the atomic layer deposition process is a spatial atomic layer deposition process.

12. The method of claim 1, wherein the first inorganic thin film comprises one or more metal oxides.

13. The method of claim 1, wherein the first inorganic thin film comprises zinc oxide.

14. The method of claim 1, wherein the deposition inhibitor exhibits an inhibition power on the surface of the substrate that is greater than 50 Å.

15. The method of claim 1, further comprising after selectively depositing the first inorganic thin film, removing the deposition inhibitor from the inhibitor areas.

16. The method of claim 15, comprising removing the deposition inhibitor from the inhibitor areas by using an oxygen plasma.

17. The method of claim 1, further comprising:
selectively depositing a second inorganic thin film only on the first inorganic thin film in the open areas on the surface of the substrate by a chemical vapor deposition process, thereby forming a two-layer patterned thin film in the open areas on the surface of the substrate, wherein the second inorganic thin film is the same as or different in material composition from the first inorganic thin film.

18. A device prepared according to the method of claim 17, wherein the device comprises the substrate, the pattern of the deposition inhibitor is in the inhibitor areas on the surface of the substrate, and the two-layer patterned thin film is in the open areas on the surface of the substrate.

19. The method of claim 1, comprising selectively depositing the first inorganic thin film while moving the substrate relative to a deposition device, at a speed of at least 0.1 cm/sec.

20. A device prepared according to the method of claim 1, wherein the device comprises the substrate and the pattern of the deposition inhibitor in the inhibitor areas on the surface of the substrate and the first inorganic thin film only in the open areas on the surface of the substrate.

21. The method of claim 1, wherein the deposition inhibitor is present in the inhibitor areas on the surface of the substrate at a dry thickness of no more than 500 Å.

* * * * *